United States Patent
Müssig

(10) Patent No.: US 7,113,388 B2
(45) Date of Patent: Sep. 26, 2006

(54) SEMICONDUCTOR CAPACITOR WITH PRASEODYMIUM OXIDE AS DIELECTRIC

(75) Inventor: Hans-Joachim Müssig, Dresden (DE)

(73) Assignees: IHP GmbH- Innovations for High Performance, Frankfurt (DE); Microelectronics/Institute Fur Innovative Mikroelektronik, Frankfurt (DE)

( * ) Notice: Subject to any disclaimer, the term of this patent is extended or adjusted under 35 U.S.C. 154(b) by 0 days.

(21) Appl. No.: 10/511,777

(22) PCT Filed: Apr. 23, 2003

(86) PCT No.: PCT/EP03/04215

§ 371 (c)(1),
(2), (4) Date: Oct. 18, 2004

(87) PCT Pub. No.: WO03/092022

PCT Pub. Date: Nov. 6, 2003

(65) Prior Publication Data

US 2005/0168915 A1    Aug. 4, 2005

(30) Foreign Application Priority Data

Apr. 23, 2002 (DE) ................ 102 18 799

(51) Int. Cl.
*H01G 4/228* (2006.01)

(52) U.S. Cl. ............... 361/306.2; 361/321.1; 361/321.2; 361/311; 361/313; 438/583; 438/585; 257/295; 257/296

(58) Field of Classification Search ..... 361/306.1–306, 361/311–313, 321.1–321, 306.2; 257/295, 257/296, 639, 640; 438/583–585, 591
See application file for complete search history.

(56) References Cited

U.S. PATENT DOCUMENTS

| | | | |
|---|---|---|---|
| 5,578,848 A * | 11/1996 | Kwong et al. | 257/296 |
| 5,679,980 A | 10/1997 | Summerfelt et al. | |
| 5,790,366 A | 8/1998 | Desu et al. | |
| 5,870,273 A | 2/1999 | Sogabe et al. | |
| 6,370,017 B1 | 4/2002 | Stenzel et al. | |
| 6,656,852 B1 | 12/2003 | Rotondaro et al. | |
| 6,700,771 B1 * | 3/2004 | Bhattacharyya | 361/311 |
| 6,897,134 B1 * | 5/2005 | Brask et al. | 438/585 |
| 6,967,154 B1 * | 11/2005 | Meng et al. | 438/622 |
| 6,979,855 B1 * | 12/2005 | Ahn et al. | 257/310 |
| 2003/0119291 A1 | 6/2003 | Ahn et al. | |
| 2003/0193061 A1 * | 10/2003 | Osten | 257/288 |
| 2003/0228747 A1 | 12/2003 | Ahn et al. | |

FOREIGN PATENT DOCUMENTS

| | | |
|---|---|---|
| DE | 100 39 327 | 10/2003 |
| WO | WO 02/31875 | 4/2002 |

* cited by examiner

*Primary Examiner*—Nguyen T. Ha
(74) *Attorney, Agent, or Firm*—Ware, Fressola, Van Der Sluys & Adolphson

(57) ABSTRACT

In accordance with the invention there is provided a semiconductor capacitor having a first semiconductor layer which forms a first capacitor electrode and which includes silicon, a second capacitor electrode and a capacitor dielectric including praseodymium oxide between the capacitor electrodes, in which provided between the capacitor dielectric including praseodymium oxide and at least the first semiconductor layer including silicon is a first thin intermediate layer representing a diffusion barrier for oxygen. In particular the thin intermediate layer can include oxynitride.

12 Claims, 1 Drawing Sheet

SEMICONDUCTOR CAPACITOR WITH PRASEODYMIUM OXIDE AS DIELECTRIC

CROSS REFERENCE TO RELATED APPLICATIONS

This application is for entry into the U.S. national phase under §371 for International Application No. PCT/EP03/04215 having an international filing date of Apr. 23, 2003, and from which priority is claimed under all applicable sections of Title 35 of the United States Code including, but not limited to, Sections 120, 363 and 365(c), and which in turn claims priority under 35 USC §119 to German Patent Application No. 102 18 799.1 filed on Apr. 23, 2002.

TECHNICAL FIELD

The invention concerns a semiconductor capacitor with praseodymium oxide as dielectric and a process for the production of a thin oxynitride layer on silicon.

BACKGROUND ART

It is no longer possible to imagine modern semiconductor technology without semiconductor capacitors. Important examples of use of semiconductor capacitors are dynamic random access memories (DRAM) in which the semiconductor capacitors are used as memory cells, and metal oxide semiconductor field effect transistors (MOSFETs) in which the substrate, the gate electrode and the gate oxide between the substrate and the gate electrode form a semiconductor capacitor.

Like all capacitors, it holds good for a semiconductor capacitor that the capacitance of the capacitor is proportional to the dielectric constant of the dielectric between the capacitor electrodes and the area of the capacitor electrodes as well as the reciprocal value of the spacing between the capacitor electrodes, that is to say the thickness of the dielectric. Silicon oxide ($SiO_2$) is frequently used as the dielectric in the semiconductor art.

With the increasing reduction in the component size in the semiconductor art, the dimensions of the capacitor plates of semiconductor capacitors, for example the gate electrodes of MOSFETs, are also progressively decreasing. This means however that the capacitance of the semiconductor capacitor is also reduced unless measures are taken to counteract that.

There are two possible ways of compensating for the reduction in the dimensions of the capacitor electrodes. The first option involves reducing the thickness of the dielectric. For example in MOSFETs in which silicon oxide is typically used as the dielectric, that gives rise to problems, with gate lengths of less than 0.1 µm. The silicon oxide for components with such short gate lengths would then have to be thinner than 1.5 nm. Such a thin silicon oxide however results in an increase in the leakage current of the MOSFET. The leakage current occurs by virtue of electrons which tunnel through the thin gate oxide between the substrate and the gate electrode. The number of tunnelling electrodes and thus the strength of the leakage current increases exponentially with a progressively decreasing silicon oxide layer thickness. It is desirable however to minimise the leakage current of an MOSFET as the aim is to consume as little electrical power as possible for controlling the current between the drain electrode and the source electrode.

The second possible way of compensating for the reduction in the capacitor electrode area involves altering not the thickness of the dielectric but the dielectric constant thereof. If for example praseodymium oxide ($Pr_2O_3$) is used as the dielectric instead of silicon oxide, the capacitance of the capacitor can be markedly increased, with the parameters involved being otherwise the same, by virtue of the praseodymium oxide having a higher dielectric constant than silicon oxide. Silicon oxide has a dielectric constant of 3.9 whereas praseodymium oxide has a dielectric constant of 30. This means that, with praseodymium oxide as the dielectric, the gate oxide can be thicker than a dielectric of silicon oxide by the factor of 30 divided by 3.9. Therefore, with praseodymium oxide as the gate dielectric, the leakage current can be drastically reduced in comparison with silicon oxide as the dielectric.

The thickness of a silicon oxide layer which, with a constant area in respect of the capacitor electrodes, affords the same capacitance as the praseodymium oxide layer, is referred to hereinafter as the equivalent oxide layer thickness. With an increasing reduction in component size, that equivalent oxide layer thickness must be reduced in order to compensate for the reduction in the capacitor electrode area. By means of praseodymium oxide as the dielectric, it is possible to increase the actual oxide layer thickness in comparison with the equivalent oxide layer thickness, and thus reduce the tunnelling leakage current.

Praseodymium oxide is typically deposited by vapor deposition of $Pr_6O_{11}$ on silicon. In that case, a mixed oxide of the form $(PrO_2)_x(SiO_2)_{1-x}$ with $0<x<1$, typically in non-stoichiometric form, is formed between the silicon and the praseodymium oxide ($Pr_2O_3$). Thermal process steps following the deposition procedure additionally result in further spreading of the mixed oxide, in particular the $SiO_2$ component.

The mixed oxide has a lower dielectric constant than the pure praseodymium oxide, whereby the equivalent oxide layer thickness of the dielectric is increased in comparison with a pure praseodymium oxide dielectric. The mixed oxide therefore worsens the electrical properties of the dielectric and thus the semiconductor capacitor, more specifically to a greater degree in proportion to an increasing thickness of the mixed oxide.

DISCLOSURE OF THE INVENTION

Therefore an object of the present invention is to develop a semiconductor capacitor with praseodymium oxide as the dielectric, in such a way that it has improved electrical properties.

That object is attained by a semiconductor capacitor according to the invention.

In accordance with the invention, to attain the above-indicated object, there is provided a semiconductor capacitor having a first semiconductor layer which forms a first capacitor electrode and which includes silicon, a second capacitor electrode and a capacitor dielectric including praseodymium oxide between the capacitor electrodes, in which provided between the capacitor dielectric including praseodymium oxide and at least the first semiconductor layer including silicon is a first thin intermediate layer representing a diffusion barrier for oxygen.

In that respect the term layer is to be interpreted as meaning not just a material region which extends in parallel relationship with the surface of a semiconductor substrate. A layer in accordance with the invention can also extend perpendicularly to or at any other angles to the substrate surface. In particular the semiconductor capacitor can be in the form of a vertical or lateral semiconductor capacitor.

The first thin intermediate layer is a diffusion barrier which prevents oxygen reaching and oxidising the silicon surface in thermal process steps which follow the step of depositing the praseodymium oxide-bearing layer. It is possible in that way to prevent the $SiO_2$ component of the $(PrO_2)_x(SiO_2)_{1-x}$ mixed oxide growing uncontrolledly as a consequence of the reaction of the silicon with oxygen, and worsening the dielectric constant of the capacitor dielectric. In addition the thin intermediate layer can also function as a shielding means for the substrate material in relation to external influences.

In accordance with a further configuration of the invention the first thin intermediate layer includes silicon oxynitride (this can occur in various stoichiometric ratios, for example SiON), hereinafter referred to for brevity as oxynitride, as a material for inhibiting oxygen diffusion. The thin intermediate layer including oxynitride, besides inhibiting oxygen diffusion, permits structural and electronic adaptation of the praseodymium oxide to the silicon-bearing semiconductor layer and can therefore be viewed as an adaptation layer. It reduces the trap density, that is to say the density of electrical state levels in the band gap of the semiconductor material, which trap free electrons and can thus produce unwanted charge states. In addition the oxynitride-containing intermediate layer does not impede heteroepitaxial growth (epitaxial growth of a material on a substrate consisting of another material) of praseodymium oxide on the silicon-containing semiconductor material, so that monocrystalline growth of the praseodymium oxide is possible.

Alternatively or in addition, it is possible as the first thin intermediate layer on the praseodymium oxide layer to apply a thin Ti layer which serves itself as a gate electrode or however as an intermediate layer between the gate dielectric and the gate electrode. Titanium as a particularly reactive transition metal can chemically bind the excess oxygen in the praseodymium oxide layer or the oxygen which possibly penetrates into that layer from the exterior. Such a titanium layer can protect the layer stack and thus the interface in relation to oxygen, irrespective of whether it originates from the atmosphere or whether it takes effect during a technological process step.

Preferably the thickness of the first thin intermediate layer is 0.5 nm or less. The thinner the first thin intermediate layer is, the correspondingly less does it influence, as part of the capacitor dielectric, the electrical properties of the capacitor. The thickness of the first thin intermediate layer can be reduced to such an extent as the production processes allow, as long as the effect thereof as a diffusion-inhibiting layer does not suffer by that.

In an embodiment of the invention the second capacitor electrode is formed from a second semiconductor layer. In addition, a second thin intermediate layer is present between the second semiconductor layer and the capacitor dielectrode containing praseodymium oxide. Uncontrolled chemical reactions between the capacitor dielectric and the second semiconductor layer can be avoided by means of the second thin intermediate layer.

Particularly when the second semiconductor layer includes silicon, it is advantageous if the second thin intermediate layer includes oxynitride or silicon oxide in order to inhibit oxygen diffusion or chemical reactions. In addition, with silicon oxide as the thin second intermediate layer, it is possible, when applying polycrystalline silicon (polysilicon) as the second semiconductor layer, for example as the gate electrode of an MOSFET, to contact the capacitor dielectric in conventional manner, that is to say as in the case of a capacitor dielectric of silicon oxide. The thickness of the second thin intermediate layer, like that of the first thin intermediate layer, is preferably also 0.5 mm or less.

Advantageously the oxynitride of the thin intermediate layers has a concentration ratio of oxygen to nitrogen (O/N concentration ratio) of 1:1.

Semiconductor capacitors in accordance with the invention can be particularly advantageously used in memory cells for dynamic random access memories (DRAM) or as a gate capacitance in field effect transistors.

In accordance with the invention there is also provided a process for the production of a thin oxynitride layer on a semiconductor material, in which firstly there is applied to the semiconductor material a very thin silicon oxide layer which is then subjected to heat treatment for nitriding purposes in a nitrogen atmosphere ($N_2$ atmosphere) at 800° C.

In addition there is also provided a process for the production of a thin oxynitride layer on silicon, in which the silicon surface is exposed at 800° C. to a nitrogen monooxide atmosphere (NO atmosphere) or a laughing gas atmosphere ($N_2O$ atmosphere).

Thin oxynitride layers for semiconductor capacitors according to the invention can advantageously be produced with the processes according to the invention. In particular, with the processes according to the invention, it is possible to produce oxynitride layers of such small thicknesses as 0.2 nm and with an O/N concentration ratio of 1:1.

BRIEF DESCRIPTION OF THE DRAWINGS

The above-described and further features and advantages of the invention are described in greater detail hereinafter by means of embodiments by way of example with reference to the accompanying drawings in which:

FIG. 1 shows a portion of the layer sequence of a semiconductor capacitor according to the invention with reference to the example of the gate capacitance of an MOSFET.

DETAILED DESCRIPTION OF THE INVENTION

Figure 1:
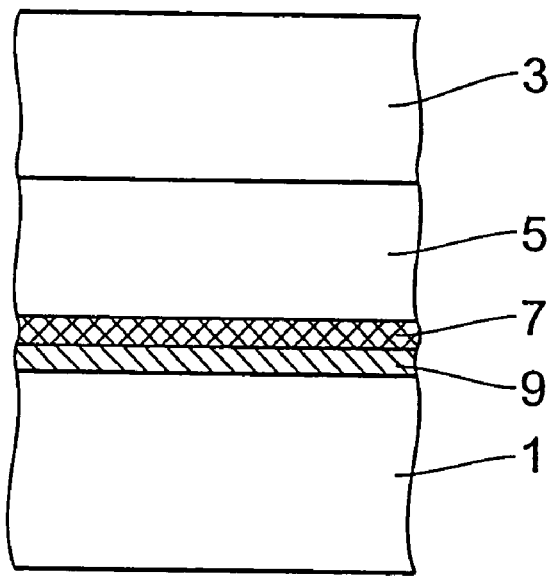
FIG. 1 shows a portion of a first embodiment of the semiconductor capacitor according to the invention.

The gate capacitance of an MOSFET of which a portion is shown in FIG. 1 includes a channel region which is formed by a silicon substrate 1 and which forms the first capacitor electrode and a polysilicon gate electrode 3 which forms the second capacitor electrode. Disposed between the silicon substrate 1 and the polysilicon gate electrode 3 is a gate dielectric 5 of praseodymium oxide ($Pr_2O_3$) as the capacitor dielectric. Provided at the interface of the gate dielectric 5, which is towards the substrate 1, is a mixed oxide layer which originates from the production process and which is of the form $(PrO_2)_x(SiO_2)_{1-x}$, wherein x can assume values in the range of greater than zero and less than one. In addition disposed between the mixed oxide 7 and the silicon substrate 1 is a thin oxynitride layer 9 which serves as a diffusion barrier for oxygen and which prevents oxygen from reaching the silicon surface of the substrate 1 through the praseodymium oxide 5 and oxidising the silicon surface during heat treatment steps which follow the deposit of the praseodymium oxide layer 5 on the silicon substrate 1. The oxynitride layer 9 is produced in the production process prior to the praseodymium oxide layer 5 being deposited.

The diffusion-inhibiting oxynitride layer 9 according to the invention makes it possible to substantially prevent oxygen diffusion to the surface of the silicon substrate and thus suppress uncontrolled growth of the mixed oxide 7. Therefore the thickness of the mixed oxide layer 7 can be reduced in comparison with the state of the art. At the same time the thin oxynitride layer 9 reduces the trap density, that is to say the density of electrical state levels in the band gap of the semiconductor material, which trap free electrons and can thus produce unwanted charge states.

Instead of an oxynitride layer 9 it is also possible to use a layer comprising another material if that material inhibits diffusion of oxygen and preferably also does not adversely affect heteroepitaxial growth of the praseodymium oxide on the substrate.

A thin oxynitride layer on silicon can be implemented for example by a procedure whereby firstly a very thin silicon oxide layer is deposited on the silicon substrate and the deposited silicon oxide layer is then subjected to heat treatment in a nitrogen atmosphere at 800° C. In that heat treatment procedure the thin silicon oxide layer is nitrided. Alternatively the thin oxynitride layer can be implemented on silicon by a procedure whereby the silicon surface of the substrate is exposed at 800° C. to an NO or $N_2O$ atmosphere. Both processes make it possible to produce oxynitride layers with a layer thickness of 0.2 nm and an O/N concentration ratio of 1:1.

Figure 2:
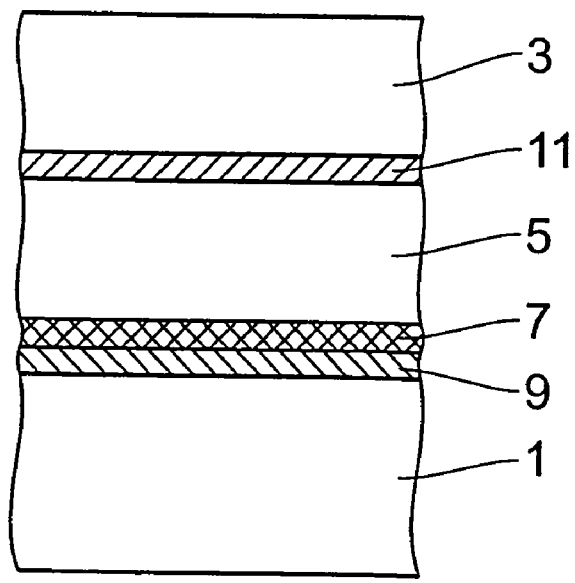
FIG. 2 shows a portion of a second embodiment of the semiconductor capacitor according to the invention.

A second embodiment by way of example is illustrated in FIG. 2. The second embodiment differs from the first embodiment only in that a silicon oxide layer 11 is arranged as the thin intermediate layer, between the gate dielectric 5 and the polysilicon gate electrode 3. Preferably that silicon oxide layer 11 is a thin $SiO_2$ layer of a thickness of 0.5 nm or less. In particular the thickness can also be less than 0.3 nm. The silicon oxide layer 11 serves as an interface layer which permits both conventional contacting, that is to say contacting as in the case of a gate dielectric consisting of silicon oxide, and also chemical reactions between the $Pr_2O_3$ gate dielectric and the polysilicon of the gate electrode during thermal process steps which follow deposit of the polysilicon gate electrode 3.

Instead of a silicon oxide layer as the thin intermediate layer 11 it is also possible to provide a thin oxynitride layer between the polysilicon gate electrode 3 and the gate dielectric 5. The thickness thereof is preferably also 0.5 nm or less and in particular less than 0.3 nm. The effects achieved with the oxynitride layer as the second intermediate layer 11 are similar to those which can be achieved with the silicon oxide layer. Thus, both oxynitride and also silicon oxide, after production of the praseodymium oxide layer, can serve as a protective layer for the praseodymium oxide and as a contacting aid when contacting the gate electrode.

In the embodiments illustrated hitherto the gate electrode 3 comprises polysilicon. It is however also possible for the gate electrode 3 to be produced from another material, for example amorphous silicon or polycrystalline or amorphous silicon germanium (SiGe). The gate electrode can include carbon or oxygen for suppressing dopant diffusion. In addition gate electrodes of other conventional materials, for example metallic gate electrodes or gate electrodes comprising metal-semiconductor compounds are also possible.

The substrate is also not restricted to a silicon substrate. It is also possible to use for example a silicon germanium substrate, a silicon germanium substrate with carbon or oxygen as a diffusion inhibitor or a silicon substrate with carbon or oxygen as a diffusion inhibitor. Likewise the substrate does not need to be present in a (001) crystal orientation.

In a further embodiment (not illustrated in the Figures) the semiconductor capacitor according to the invention serves as a memory element for a memory cell of a dynamic random access memory (DRAM). A praseodymium oxide layer is arranged as a dielectric between two capacitor electrodes comprising a semiconductor material, for example crystalline, polycrystalline or amorphous silicon or silicon germanium, in each case with or without carbon or oxygen. Disposed between the praseodymium oxide and the semiconductor material of the capacitor electrodes is a silicon oxide layer or an oxynitride layer with which it is possible to prevent unwanted reactions between the $Pr_2O_3$ dielectric and the semiconductor material of the capacitor electrodes.

Configurations of the memory element are also possible, in which an intermediate layer is present only between one of the capacitor electrodes and the praseodymium oxide layer.

The invention claimed is:

1. A semiconductor capacitor having a first semiconductor layer which forms a first capacitor electrode (1) and which includes silicon, a second capacitor electrode (3) and a capacitor dielectric (5) including praseodymium oxide between the capacitor electrodes (1, 3), characterised in that provided between the capacitor dielectric (5) including praseodymium oxide and at least the first semiconductor layer (1) including silicon is a first thin intermediate layer (9) serving as a diffusion barrier for oxygen.

2. A semiconductor capacitor as set forth in claim 1 characterised in that the first thin intermediate layer (9) includes oxynitride or titanium.

3. A semiconductor capacitor as set forth in claim 2 wherein the oxynitride of the first or the second thin intermediate layer (9, 11) has a concentration ratio of oxygen to nitrogen of 1:1.

4. A semiconductor capacitor as set forth in claim 1 or claim 2 wherein the thickness of the first thin intermediate layer (9) is 0.5 nm or less.

5. A semiconductor capacitor as set forth in claim 1 wherein the second capacitor electrode (3) is formed from a second semiconductor layer and there is a second thin intermediate layer (11) between the second semiconductor layer and the capacitor dielectric (5) and the second semiconductor layer includes praseodymium.

6. A semiconductor capacitor as set forth in claim 5 wherein the second thin intermediate layer (11) includes oxynitride.

7. A semiconductor capacitor as set forth in claim 6 wherein the oxynitride of the first or the second thin intermediate layer (9, 11) has a concentration ratio of oxygen to nitrogen of 1:1.

8. A semiconductor capacitor as set forth in claim 5 wherein the second thin intermediate layer (11) includes silicon oxide.

9. A semiconductor capacitor as set forth in claim 5 wherein the thickness of the second thin intermediate layer (11) is 0.5 nm or less.

10. A memory cell for a dynamic random access memory, which includes a semiconductor capacitor as set forth in claim 1.

11. A field effect transistor comprising a substrate (1), a gate oxide layer (5) and a gate electrode (3), which includes a semiconductor capacitor as set forth in claim 1, wherein the substrate (1) forms the first capacitor electrode, the gate electrode (3) forms the second capacitor electrode and the gate oxide (5) forms the capacitor dielectric.

12. A semiconductor capacitor as set forth in claim 1 wherein the first thin intermediate layer (9) is titanium.

* * * * *